(12) United States Patent
Ishiguri et al.

(10) Patent No.: US 7,064,436 B2
(45) Date of Patent: Jun. 20, 2006

(54) SEMICONDUCTOR DEVICE AND METHOD OF FABRICATING THE SAME

(75) Inventors: Masahiko Ishiguri, Kawasaki (JP);
Hirohisa Matsuki, Kawasaki (JP);
Hiroyuki Yoda, Kawasaki (JP);
Tadahiro Okamoto, Kawasaki (JP);
Masamitsu Ikumo, Kawasaki (JP);
Shuichi Chiba, Sagamihara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/995,081

(22) Filed: Nov. 23, 2004

(65) Prior Publication Data

US 2005/0140004 A1    Jun. 30, 2005

(30) Foreign Application Priority Data

Dec. 10, 2003    (JP)    ............................ 2003-411592

(51) Int. Cl.
*H01L 23/48*    (2006.01)
*H01L 23/52*    (2006.01)

(52) U.S. Cl. ..................... 257/738; 257/778; 257/779; 257/E23.021; 257/E23.069

(58) Field of Classification Search ................ 257/737, 257/738, 751, 772, 779, 778, E23.021, E23.069; 228/180.22; 438/613–617
See application file for complete search history.

(56) References Cited

U.S. PATENT DOCUMENTS

| | | | |
|---|---|---|---|
| 5,726,501 A | * | 3/1998 | Matsubara ................... 257/778 |
| 5,880,017 A | * | 3/1999 | Schwiebert et al. ........ 438/613 |
| 2002/0113312 A1 | * | 8/2002 | Clatanoff et al. ........... 257/737 |

FOREIGN PATENT DOCUMENTS

| | | |
|---|---|---|
| JP | 2985426 | 10/1991 |
| JP | 11-195665 | 7/1999 |
| JP | 2000-133667 | 5/2000 |
| JP | 3407839 | 3/2003 |

* cited by examiner

*Primary Examiner*—Jasmine Clark
(74) *Attorney, Agent, or Firm*—Westerman, Hattori, Daniels & Adrian, LLP

(57) ABSTRACT

A semiconductor device includes a semiconductor substrate and an array of protruding electrodes arranged at a pitch X1. Each of the protruding electrodes has a height X3 and is formed on a barrier metal base of diameter X2 coupled to an electrode arranged on the semiconductor substrate so as to satisfy the relations $(X1/2) \leq X2 \leq (3*X1/4)$ and $(X1/2) \leq X3 \leq (3*X1/4)$.

2 Claims, 13 Drawing Sheets

EXAMPLE OF ASHING CONDITION

| ASHING METHOD | MICROWAVE TREATMENT |
|---|---|
| RF POWER | 800W |
| ASHING TIME | 60 SEC |
| SUBSTRATE TEMPERATURE | 50°C |

FIG.14

EXAMPLE OF ACID IMMERSION

| LIQUID | ACID-BASED CLEANER |
|---|---|
| LIQUID TEMPERATURE | 40°C |
| IMMERSION TIME | 60 SEC |
| POST-IMMERSION TREATMENT | 10-SEC WATER RINSING |

FIG.15

EXAMPLE OF RINSING IN WATER

| SHOWER TEMPERATURE | ROOM TEMPERATURE |
|---|---|
| SHOWER PRESSURE | 0.3MPa |
| SHOWER TIME | 60 SEC |

FIG.16

EXAMPLE OF 2ND ASHING CONDITION

| ASHING METHOD | MICROWAVE TREATMENT |
|---|---|
| RF POWER | 800W |
| ASHING TIME | 30 SEC |
| SUBSTRATE TEMPERATURE | 50°C |

FIG.17

RESULT OF PRETREATMENT

| ASHING | ● | – | – | – | ● | ● | ● | – | – | ● |
|---|---|---|---|---|---|---|---|---|---|---|
| ACID IMMERSION | – | ● | – | – | ● | ● | ● | ● | ● | ● |
| 2ND ASHING | – | – | – | – | – | – | ● | ● | ● | ● |
| WATER RINSING | – | – | ● | ● | ● | – | ● | – | ● | ● |
| PLATING PERFORMANCE | △ | △ | △ | △ | △ | ○ | △ | △ | ○ | ◎ |

● : IMPLEMENTED
– : NOT IMPLEMENTED
◎ : EXCELLENT
○ : SATISFACTORY
△ : RELATIVELY GOOD

SEMICONDUCTOR DEVICE AND METHOD OF FABRICATING THE SAME

BACKGROUND OF THE INVENTION

1. Field of the Invention

The present invention generally relates to a semiconductor device and its fabricating method, and particularly, to a semiconductor device with narrow-pitch protruding electrodes.

2. Description of the Related Art

In recent years, semiconductor devices incorporated in electric equipment have been made smaller and smaller along with miniaturization of the electric equipment. A semiconductor device or a semiconductor chip has bumps (protruding electrodes) on its device surface, while a circuit board on which the semiconductor chip is placed is furnished with electrodes corresponding to the bumps. The semiconductor chip is mounted on the circuit board through a flip-chip process with the bumps being coupled with the circuit board electrodes. In order to further miniaturize the semiconductor chip, the pitch of the protruding electrodes has to be further narrowed.

Conventionally, protruding electrodes made of solder (hereinafter, referred to as "bumps") are formed on the device surface of a semiconductor chip by solder paste printing, solder ball transfer, solder plating, or other techniques. The bump pitch used to be 500 μm, which has been narrowed to 250 μm, and further to 200 μm, along with the progress of high-density technologies. It is expected that in the near future a grid-array bump pitch of less than 50 μm is required. With such a narrow pitch, slight positional offset of the semiconductor chip with respect to the circuit board generally prevents reliable electrical connection. However, by making use of the self-aligning phenomenon occurring when spherical solder ball bumps are employed, the positional offset can be self-corrected. For this reason, spherical solder bumps are desired.

On the other hand, a structural problem occurs in narrow-pitch flip-chip mounting. A large amount of stress is applied to the bumps due to difference in the thermal expansion characteristic between the circuit board and the semiconductor chip. Under large stress on the bumps, the reliability in electrical connection between the semiconductor chip and the circuit board is degraded. To reduce the stress, it is necessary to make the height of the bumps as great as possible with respect to the bump pitch and to maintain the adhesion or contact between the base metal of the solder ball and the underlying layer.

Concerning the fabrication aspect, paste printing is unsuitable for forming narrow pitch solder bumps because the grain size of a typical solder paste is similar to the pitch size. Ball transfer processes are also unsuitable because such small balls cannot be held reliably. Consequently, plating is selected.

When fabricating bump electrodes on a semiconductor chip by electrolytic plating, a resist pattern defining a bump array is formed, and then metal is grown in the resist pattern by electrolytic plating. Such a method is disclosed in, for example, JP 11-195665A (Kokai), at pages 7–8 and in FIG. 2.

However, if the pitch of the ball grid array becomes narrower, the opening pattern of the resist layer becomes finer, and the aspect ratio (the ratio of the depth to the inner diameter of the opening) becomes large. This makes it difficult for the electrolytic plating liquid to get into the openings of the resist pattern because a resist material generally has a hydrophobic nature and sheds the plating liquid.

If the openings of the resist pattern cannot be sufficiently filled with the electrolytic plating liquid, the thickness of the growing plating layer varies, and uniform-shaped bumps cannot be fabricated. Such non-uniform bumps greatly reduce the reliability in electrical connection between the semiconductor chip and the circuit board.

SUMMARY OF THE INVENTION

The present invention was conceived to overcome the above-described problems, and it is an object of the present invention to provide a semiconductor device with uniform narrow-pitch protruding electrodes with a high aspect ratio.

To achieve the object, in one aspect of the invention, a semiconductor device is provided. The semiconductor device comprises a semiconductor substrate and an array of protruding electrodes arranged at a pitch X1. Each of the protruding electrodes has a height X3 and is formed on a barrier metal base of diameter X2 coupled to an electrode formed on the semiconductor substrate so as to satisfy the relations $$(X1/2) \leq X2 \leq (3*X1/4) \text{ and}$$

$$(X1/2) \leq X3 \leq (3*X1/4).$$

This arrangement can achieve a narrow-pitch protruding electrode array, while adequate height of the protruding electrodes is guaranteed. Consequently, the bonding reliability is improved when mounting the semiconductor device on a circuit board in a flip-chip mounting process.

In a preferred example, the barrier metal base is a combination of a Ni layer, a Cu layer, and a Ti layer arranged in this order from the top, and the Ti layer has a side etch ranging from 100 nm to 200 nm with respect to the Cu layer.

In another aspect of the invention, a semiconductor device fabricating method is provided. The method includes the steps of:

(a) forming a seed layer on a semiconductor substrate;

(b) forming a resist mask having an opening at a position corresponding to an electrode located on the semiconductor substrate, the seed layer being exposed in the opening;

(c) forming a barrier metal base including the seed layer exposed in the opening;

(d) forming a protruding electrode on the barrier metal base by plating; and (e) after the resist mask forming step and before the plating step, performing a pre-treatment process in which at least one of an ashing process, an acid immersion process, and a water rinsing process is carried out.

Since at least one of the ashing process, the acid immersion process, and the water rinsing process is performed before the plating step, the wetting characteristic or the plating-attracting characteristic of the resist mask with respect to plating liquid is improved. Accordingly, the plating liquid is easily introduced into the opening with a high aspect ratio, and protruding electrodes with a sufficient and uniform height can be fabricated.

The method further includes the steps of removing the resist mask after the protruding electrode is formed in the opening, and shaping the barrier metal base by wet etching.

Preferably, the step of forming the protruding electrode includes performing fluxless reflow on the protruding electrode using carboxylic acid to shape the protruding electrode.

This arrangement allows the reducing power to be controlled easily, as compared with the conventional flux reflow process. Because the spread of the solder to the surroundings is well-controlled, short circuits are prevented from occurring between adjacent protruding electrodes.

Thus, a highly reliable semiconductor device with a narrow-pitch protruding electrode array is realized, while preventing short circuits between adjacent electrodes during the reflow process.

BRIEF DESCRIPTION OF THE DRAWINGS

Other objects, features, and advantages of the present invention will become more apparent from the following detailed description when read in conjunction with the accompanying drawings, in which:

FIG. 14 is a table illustrating an example of the acid immersion condition carried out as pretreatment prior to the plating step;

FIG. 15 is a table illustrating an example of the water rinsing condition carried out as pretreatment prior to the plating step;

FIG. 16 is a table illustrating an example of the second ashing condition carried out as pretreatment prior to the plating step; and FIG. 17 is a table illustrating the effect of the pretreatment carried out according to an embodiment of the invention.

DETAILED DESCRIPTION OF THE PREFERED EMBODIMENTS

The preferred embodiments of the present invention are now described below with reference to the attached drawings.

Figure 1:
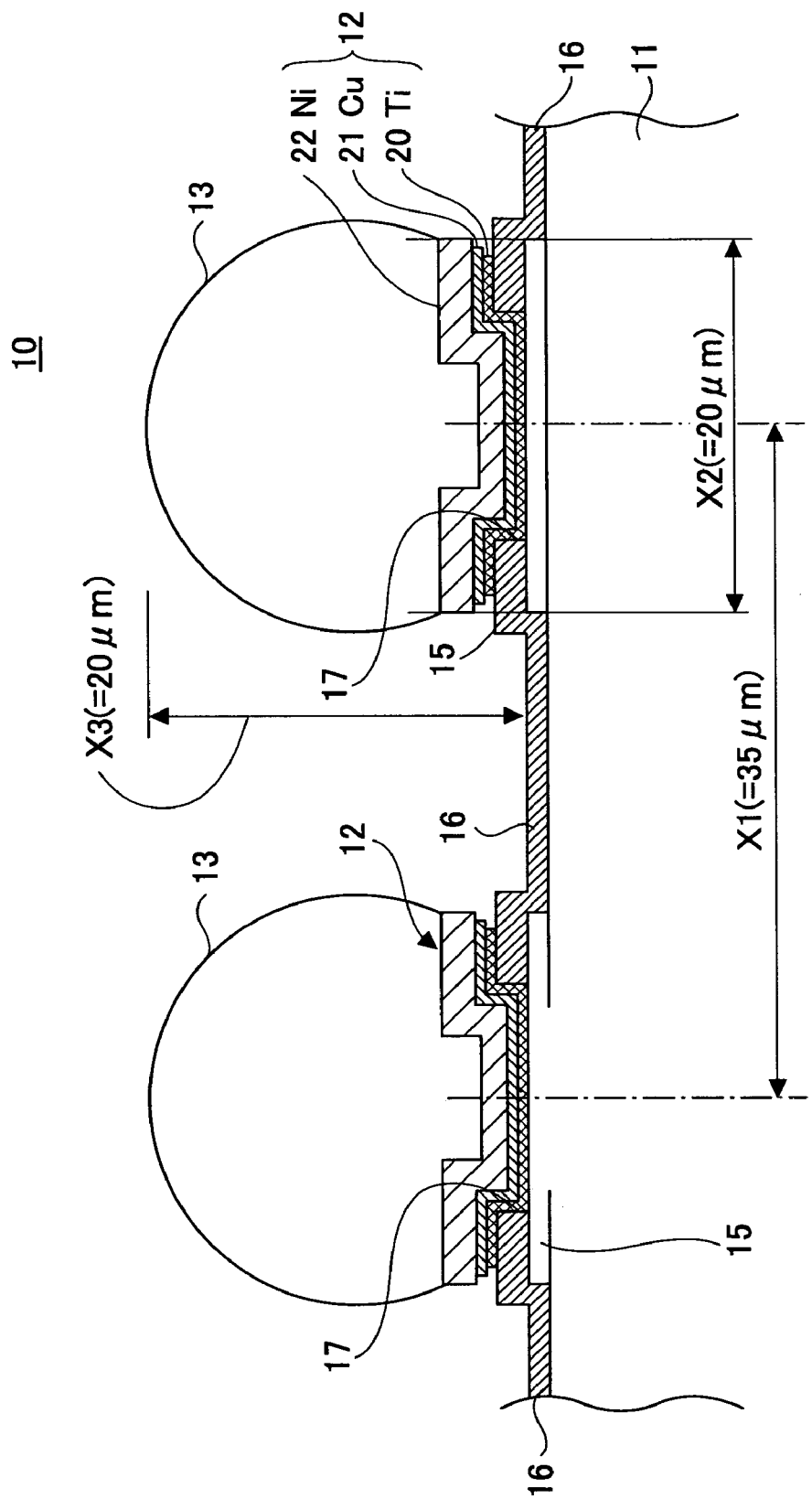
FIG. 1 is a diagram illustrating a solder bump on a barrier metal base formed on a semiconductor device according to an embodiment of the invention.

FIG. 1 is a cross-sectional view of protruding electrodes formed on a semiconductor device via a barrier metal base according to an embodiment of the present invention. Although the preferred embodiment of the present invention is described below using an example of the semiconductor device 10 illustrated in FIG. 1, the present invention is not limited to this example.

In FIG. 1, a barrier metal base 12 is inserted between a solder ball 13 and an aluminum electrode 15 formed on a semiconductor substrate 11. The semiconductor device 10 is bonded onto a mount board, such as an interposer, by a flip-chip process. The semiconductor device 10 includes the semiconductor substrate 11, the aluminum electrode 15, a cover layer 16 covering a portion of the aluminum electrode 15, the barrier metal base 12 formed on the aluminum electrode 15, and the protruding electrode 13 formed on the barrier metal base 12.

The semiconductor substrate 11 is, for example, a silicon substrate on which a prescribed circuit is structured. On the device-forming face (in which the circuit is formed) of the semiconductor substrate 11 are formed aluminum electrodes 15 and a cover layer 16. The aluminum electrodes 15 are electrically connected to the circuit formed on the device-forming face of the semiconductor substrate 11, and function as input/output terminals or power source terminals.

The aluminum electrodes 15 are arranged in an area array of a narrow pitch (between adjacent aluminum electrodes) at or less than 50 μm to realize a high-density semiconductor device. In the preferred example, the pitch of the aluminum electrodes 15 is set to 35 μm.

The cover layer 16 is made of a dielectric material such as silicon dioxide (SiO2), and protects the device-forming face of the semiconductor device 10. In the example, the cover layer 16 covers the periphery of the aluminum electrode 15 so as to allow the center portion of the aluminum electrode 15 to be exposed for physical contact with the barrier metal base 12. In other words, the cover layer 16 defines a window 17 on the aluminum electrode 15.

The barrier metal base 12 is inserted between the protruding electrode 13 and the aluminum electrode 15 for the purpose of preventing diffusion or reaction from occurring between them. In the preferred embodiment, the barrier metal base 12 consists of layers of multiple metals.

To be more precise, the barrier metal base 12 includes a Ti layer 20, a Cu layer 21, and a Ni layer 22 arranged in this order from the bottom. The Ti layer 20 is in contact with the aluminum electrode 15. The thickness of the Ti layer 20 is about 100 nm, the thickness of the Cu layer 21 is about 250 nm, and the thickness of the Ni layer 22 is about 4.5 μm. The top surface of the Ni layer 22, which directly contacts the protruding electrode 13, may be furnished with an alloy layer containing Ni.

The protruding electrode 13 is shaped into a sphere (and therefore, the protruding electrode 13 is referred to as a "solder ball"). The solder ball 13 is made of Pb—Sn alloy or Sn—Ag alloy, for example. Alternatively, a solder material containing indium may be used. The solder ball 13 is bonded onto the barrier metal base 12, and therefore electrically connected to the aluminum electrode 15 via the barrier metal base 12. The solder ball 13 is formed by a reflow process, which is described below.

The dimensions of the solder ball 13 and the barrier metal base 12 are determined so as to satisfy a prescribed condition.

Assuming that the pitch of the solder balls 13 is X1, that the diameter of the barrier metal base 12 is X2, and that the height of the solder ball 13 from the semiconductor substrate 11 is X3, then the relations of $$(X1/2) \leq X2 \leq (3*X1/4) \quad (1)$$

and $$(X1/2) \leq X3 \leq (3*X1/4) \quad (2)$$

are satisfied.

Since the solder ball 13 is formed over the aluminum electrode 15, the pitch X1 of the solder balls 13 is equal to the pitch of the aluminum electrodes 15. The diameter X2 of the barrier metal base 12 is the largest diameter of the three metal layers 20, 21, and 22 included in the barrier metal base 12. In this example, X2 denotes the diameter of the Ni layer 22. The height X3 of the solder ball 13 is the distance from the top face of the cover layer 16 to the top of the solder ball 13.

In this example, the pitch X1 of the solder balls 13 is set to 35 μm, the diameter X2 (corresponding to the diameter of the Ni layer 22) of the barrier metal base 12 is set to 20 μm, and the height X3 of the solder ball 13 is set to 20 μm. Half of X1 (X1/2) is 17.5 μm, and three quarters of X1 is 26.25 μm. The diameter X2 of the barrier metal base 12 and the height X3 of the solder ball 13 satisfy equations (1) and (2), respectively. (In this example, X2=X3=20 μm.) By forming the barrier metal base 12 and the solder balls 13 so as to satisfy equations (1) and (2), a narrow-pitch solder ball array is realized, while maintaining the height of the solder ball 13 sufficiently high. The reliability of the flip-chip process for bonding the semiconductor device 10 is improved.

Next, explanation is made of the process for fabricating the semiconductor device 10 with the above-described structure, with reference to FIG. 2 through FIG. 16. The explanation is made focusing on formation of the barrier metal base 12 and the solder ball 13 because the other steps are performed using known techniques.

Figure 2:
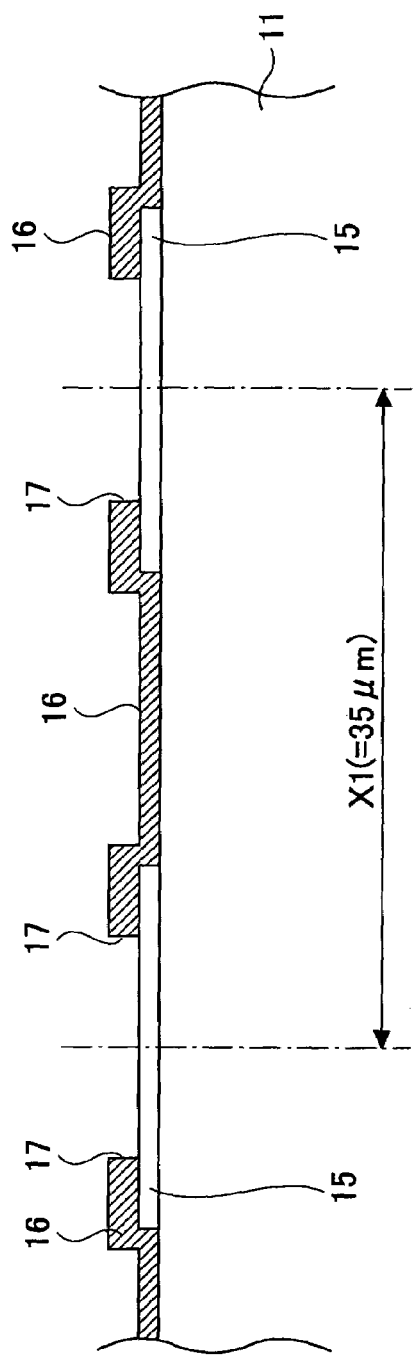
FIG. 2 illustrates preparing a semiconductor substrate with metal electrodes when fabricating a semiconductor device according to an embodiment of the invention.

First, a semiconductor substrate 11 is prepared, as illustrated in FIG. 2. The semiconductor substrate 11 is fabricated by a known process, and aluminum electrodes 15 are formed on the semiconductor substrate 11 at prescribed positions. The aluminum electrodes 15 are electrically connected to the circuits (not shown) formed on the semiconductor substrate 11. The top surface of the semiconductor substrate 11 is covered with a cover layer 16 so as to expose the aluminum electrodes 15 at openings 17. The cover layer 16 is made of, for example, silicon dioxide (SiO2).

Figure 3:
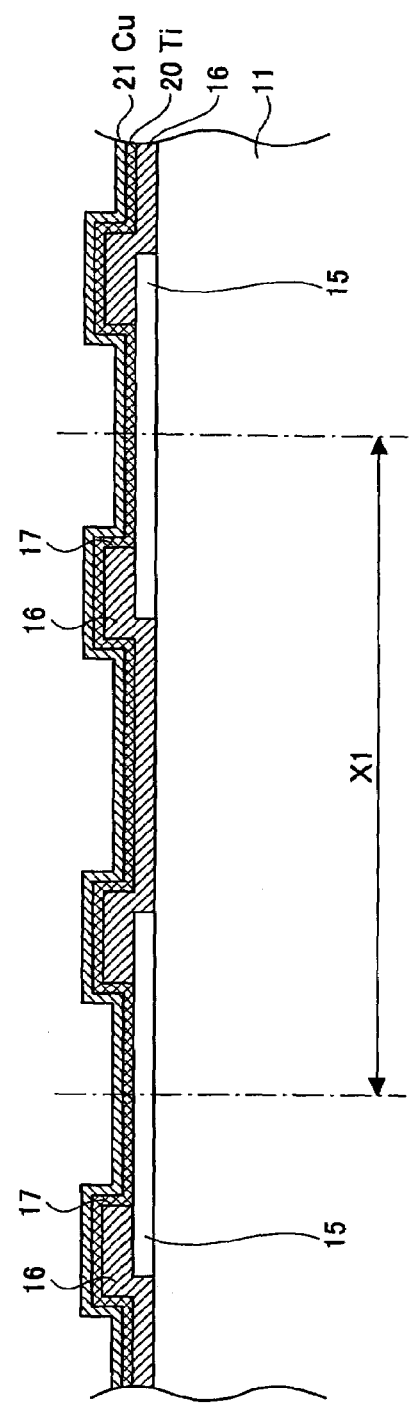
FIG. 3 illustrates forming a seed layer made of a Cu layer arranged on a Ti layer in the fabricating process of the semiconductor device according to an embodiment of the invention.

Then, as illustrated in FIG. 3, a Ti layer 20 and a Cu layer 21 are formed on the entire surface of the semiconductor substrate 11 in this order. The Ti layer 20 and the Cu layer 21 define a seed layer. The Ti layer 20 is formed by sputtering up to the thickness of 100 nm. Then, the Cu layer 21 is formed by sputtering up to the thickness of 250 nm.

It is desired that the thickness of the Ti layer 20 ranges from 50 nm to 100 nm. The Cu layer 21 may be replaced by a 250-nm thick Ni layer located on the Ti layer 20. The first metal seed layer formed directly on the semiconductor substrate 11 is titanium (Ti) from the viewpoints of size control after etching and adhesion to the aluminum electrode 15.

Figure 4:
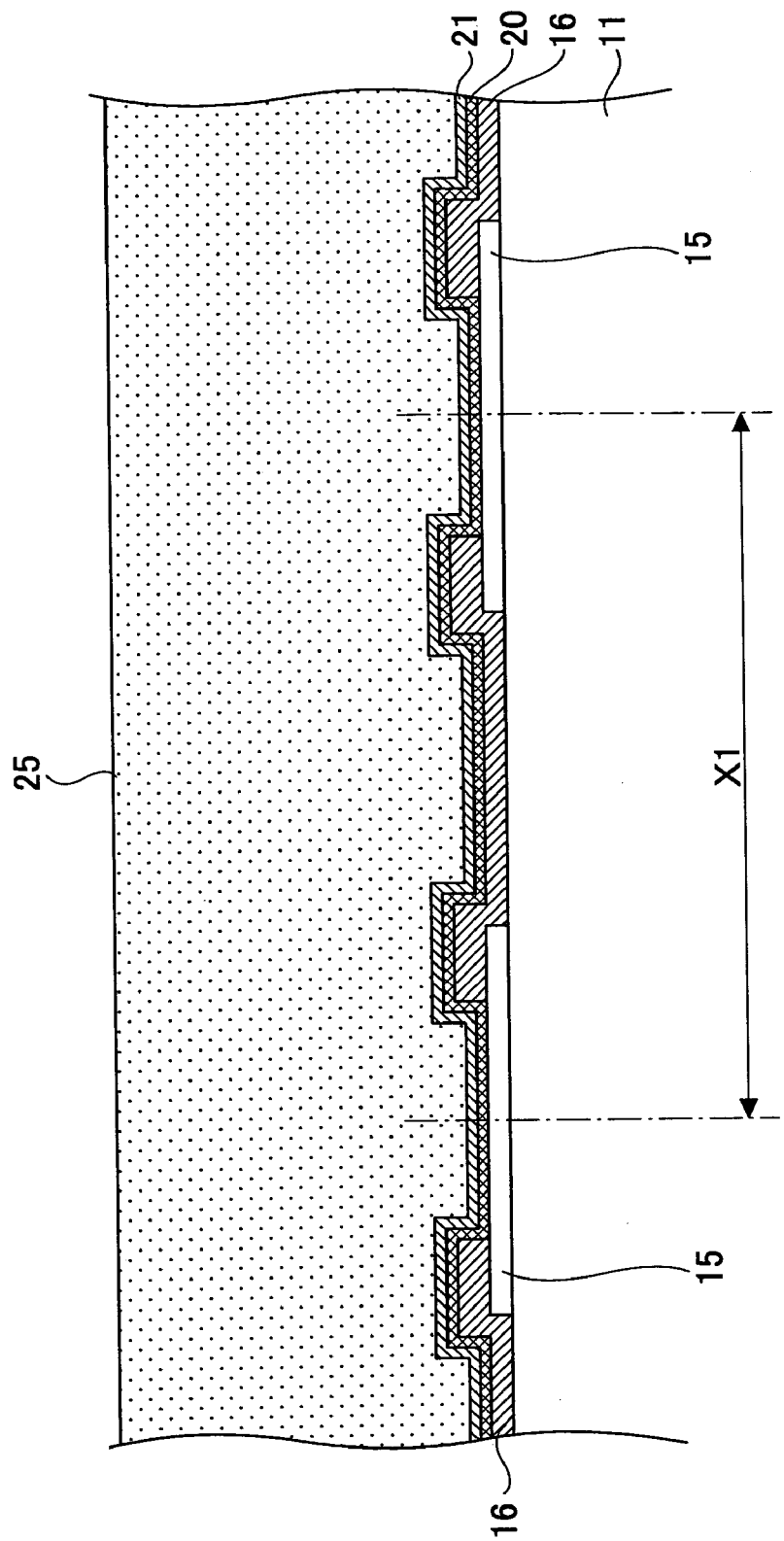
FIG. 4 illustrates forming a resist layer on the semiconductor substrate in the fabricating process of the semiconductor device according to an embodiment of the invention.

Then, as illustrated in FIG. 4, a positive-type photoresist (hereinafter, referred to simply as "resist") 25 is formed by coating the entire surface of the semiconductor substrate 11 covered with the Ti layer 20 and the Cu layer 21 with the resist 25 so as to have a uniform thickness. The resist 25 is a plating resist, such as PMER-LA900 (product name, manufactured and sold by Tokyo Ohka Kogyo Co. Ltd.).

Figure 5:
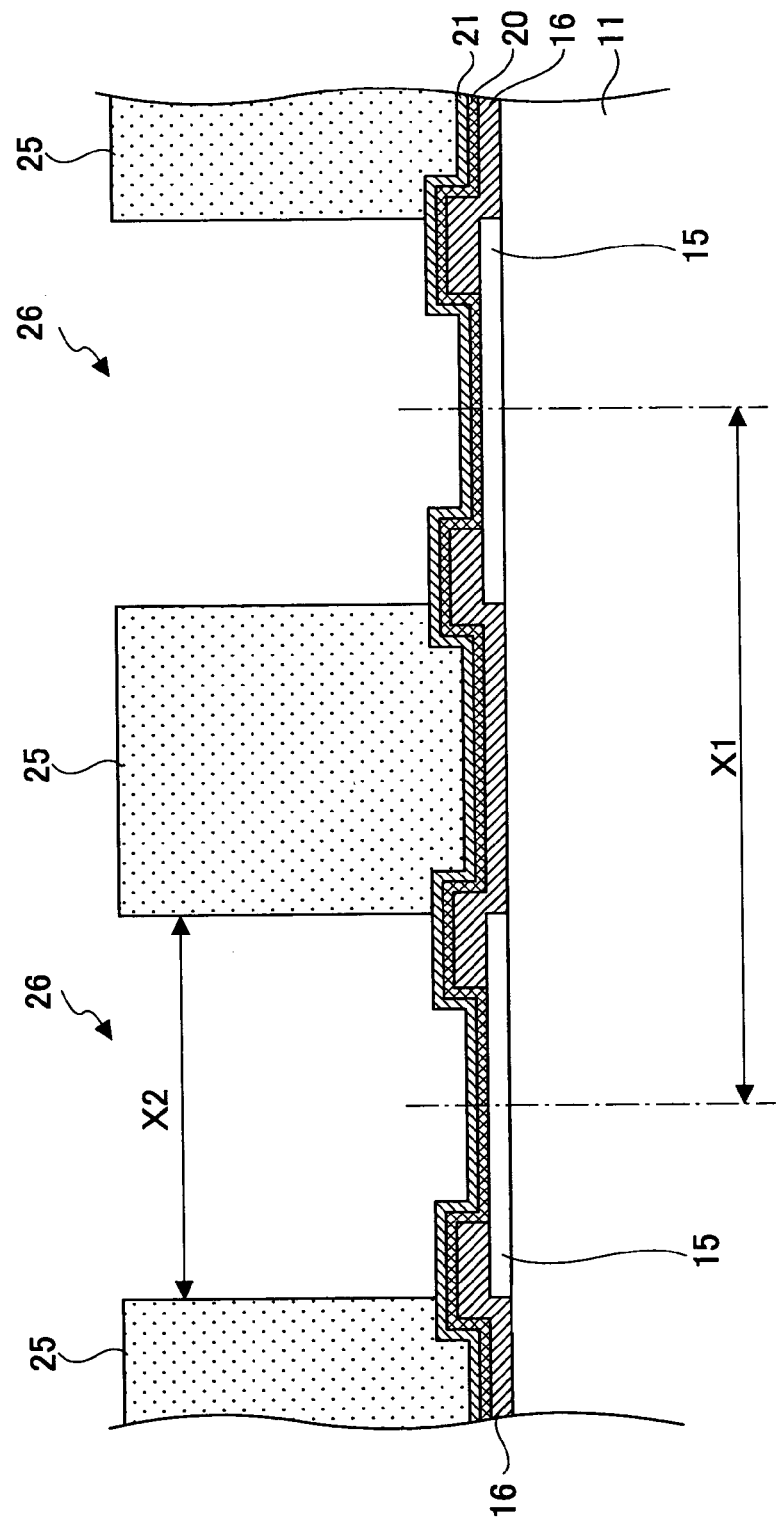
FIG. 5 illustrates forming an opening in the resist in the fabricating process of the semiconductor device according to an embodiment of the invention.

Then, as illustrated in FIG. 5, an opening pattern 26 is formed in the resist 25 through exposure and development. The diameter of the opening pattern 26 is selected so as to satisfy equation (1). In this example, the diameter of the opening pattern 26 is set to 20 μm, which equals the diameter X2 of the barrier metal base 12. With the solder plating resist 25, designing the diameter X2 of the opening 26 so as to be equal to the thickness (20 μm) of the resist layer 25 is substantially the performance limitation of the resist patterning process.

After the opening pattern 26 is formed in the resist 25, a pretreatment process is carried out prior to electrolytic plating for forming the Ni layer 22 and the solder 27 as described below. In the preferred embodiment, the first ashing process is carried out under the conditions defined in FIG. 13, and then an acid immersion process is carried out under the conditions defined in FIG. 14. Then, the ashing process of FIG. 13 is performed again, and finally, the water rinsing process is performed to wash out the surface of the resist 25 under the conditions defined in FIG. 15.

To prevent oxidation of the surface of resist 25, which is to be plated, the second ashing condition may be weakened, as defined in FIG. 16.

Figure 6:
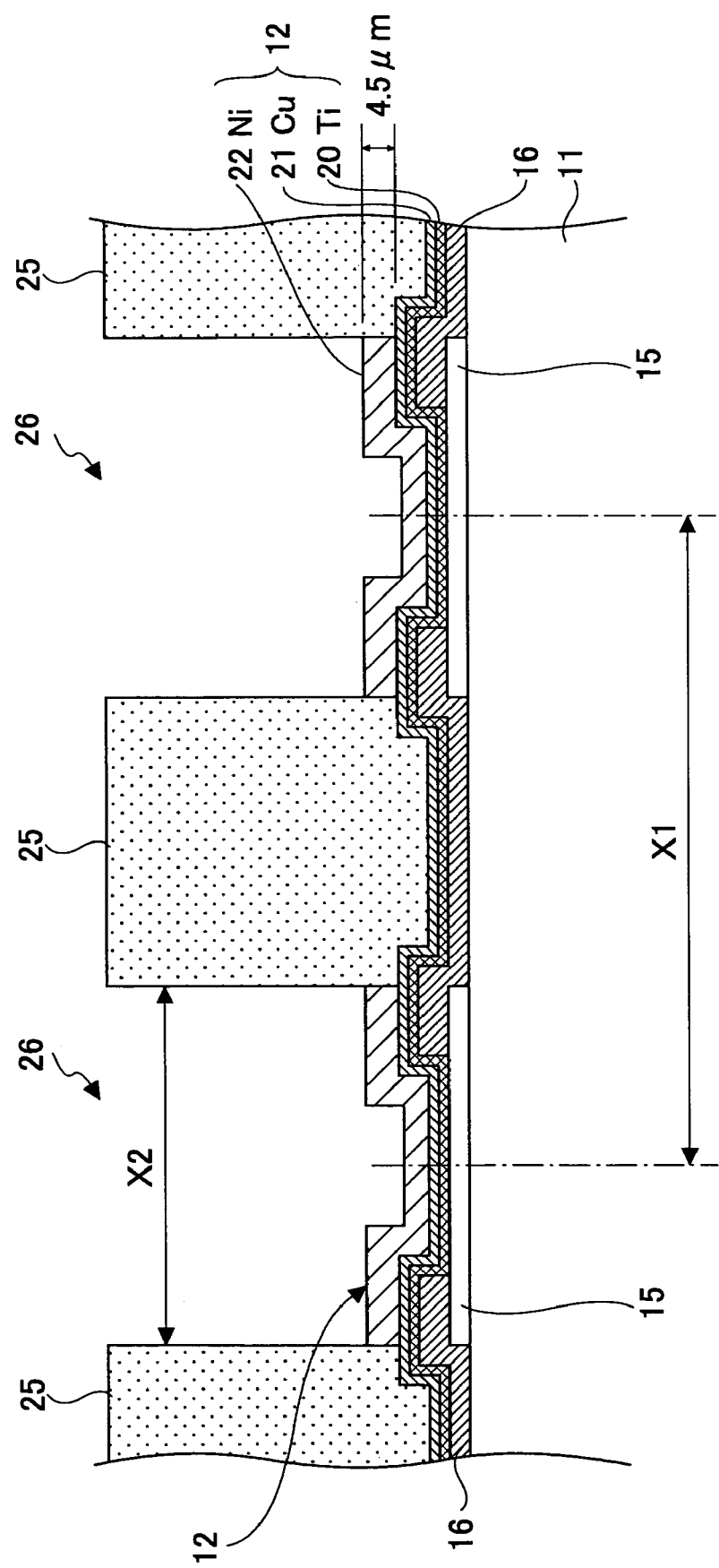
FIG. 6 illustrates forming a barrier metal base in the opening in the fabricating process of the semiconductor device according to an embodiment of the invention.

After the pretreatment, a Ni layer 22 is formed in the opening 26 up to the thickness of 4.5 μm by electrolytic plating, with the water-rinsed resist surface still wet, to complete a barrier metal base 12, as illustrated in FIG. 6. The Ni layer 22 grows in the electrolytic plating process, using the Ti layer 20 and the Cu layer 21 as the seed layer. Although not shown in the drawing, the top surface of Ni layer 22 may be covered with a Ni-containing alloy plating layer, such as Ni—Fe alloy or Ni—Co alloy. This arrangement improves the wetting characteristic of the barrier metal base 12 with respect to the solder 27.

Figure 7:
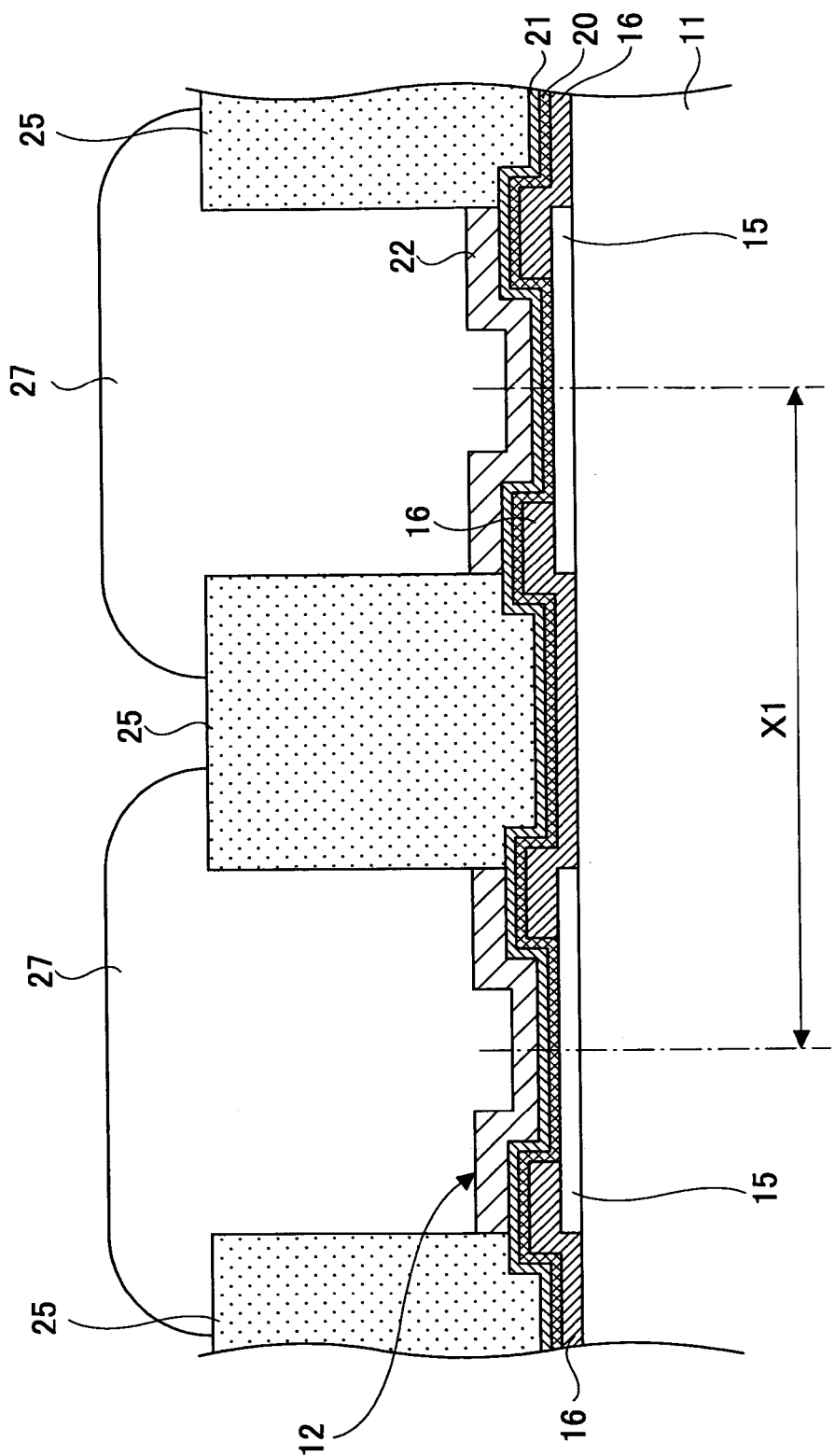
FIG. 7 illustrates growing solder in the opening in the fabricating process of the semiconductor device according to an embodiment of the invention.

Then, as illustrated in FIG. 7, the opening 26 is filled with Sn—Ag solder 27 by electrolytic plating, with the Ni layer 22 and the Cu/Ti seed layer 21/20 between the solder 27 and the aluminum electrode 15. The electrolytic plating of the solder 27 is also performed using the Cu layer 21 and the Ti layer 20 as the seed. The material of the solder 27 is not limited to Sn—Ag, but Pb—Sn or indium solder may be used.

The pretreatment processing, including ashing, acid immersion and water rinsing, carried out prior to the electrolytic plating processes (shown in FIG. 6 and FIG. 7) greatly improves the surface property of the resist 25 and increases the plating-attracting characteristic with respect to the plating liquid.

Consequently, the electrolytic plating liquids used to form the Ni layer 22 and the solder 27 easily get into the opening 26 with a high aspect ratio, and a high-aspect fine-patterned solder 27 is achieved with an adequate and uniform height.

Although in the above described embodiment the pretreatment is performed by successively carrying out the first ashing, acid immersion, the second ashing, and water rinsing in this order, the order of these processes is not limited to this specific example. FIG. 17 shows a variety of combinations of these processes and the corresponding pretreatment effect. It is clearly understood from FIG. 17 that the plating performance is improved, as compared with the conventional method, by performing at least one of the first ashing, acid immersion, the second ashing, and water rinsing. By optimizing the combination, the plating-attracting characteristic of the resist 25 with respect to the plating liquid is improved, and the electrolytic plating liquids for forming the Ni layer 22 and the solder 27 can be easily introduced in the opening 26.

Figure 8:
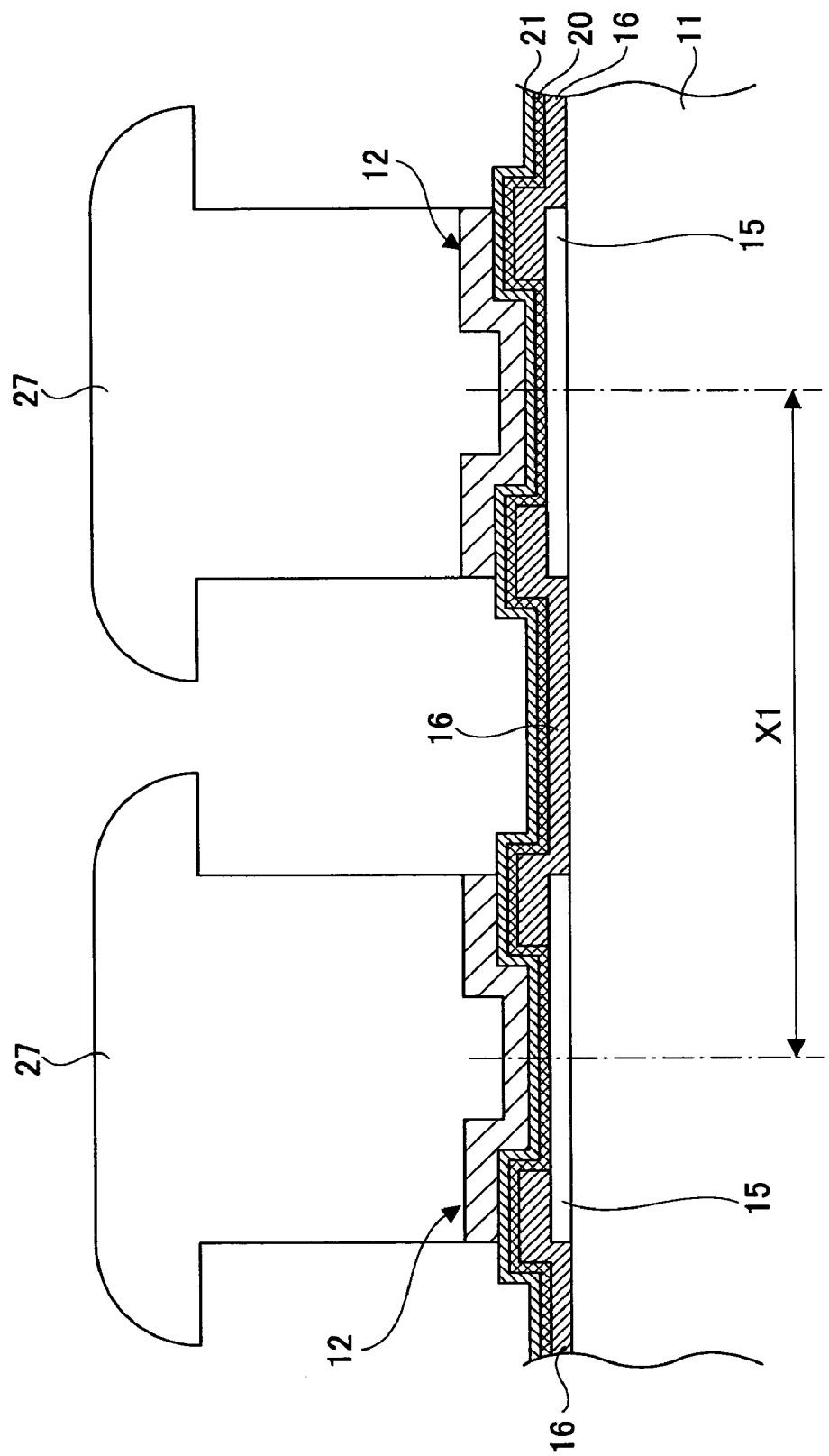
FIG. 8 illustrates removing the resist in the fabricating process of the semiconductor device according to an embodiment of the invention.

After the electrolytic plating process of the solder 27, the resist 25 is removed, and the Ni layer 22 is etched, as illustrated in FIG. 8. The etching of the Ni layer 22 is a part of the shaping process of the barrier metal base 12.

Figure 9:
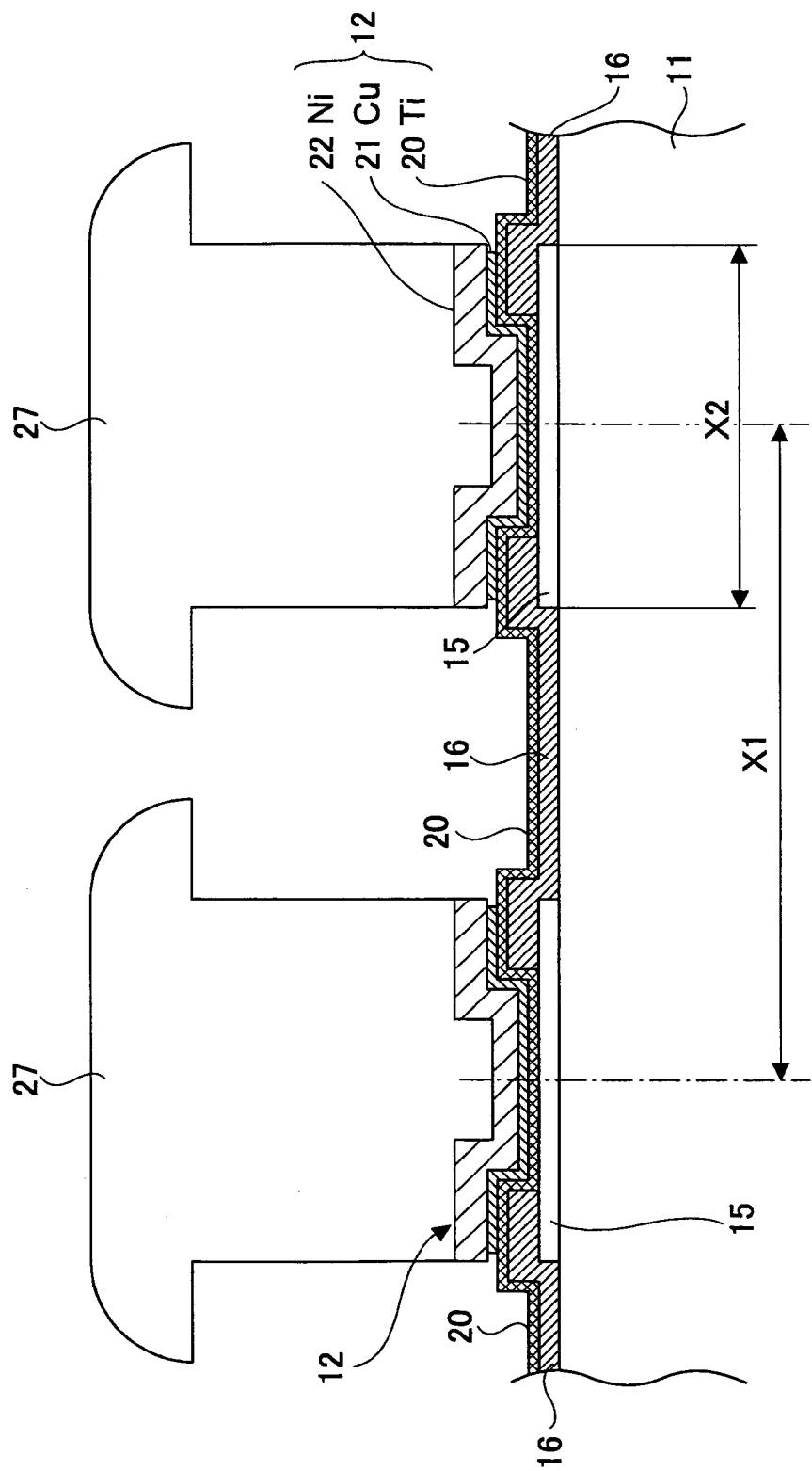
FIG. 9 illustrates etching the Cu seed layer using the Ni layer of the barrier metal base as a mask in the fabricating process of the semiconductor device.

Then, as illustrated in FIG. 9, the Cu layer 21 is wet-etched using the Ni layer 22 as a mask. The etchant is, for example, a mixed liquid of oxygenated water and acetic acid.

Figure 10:
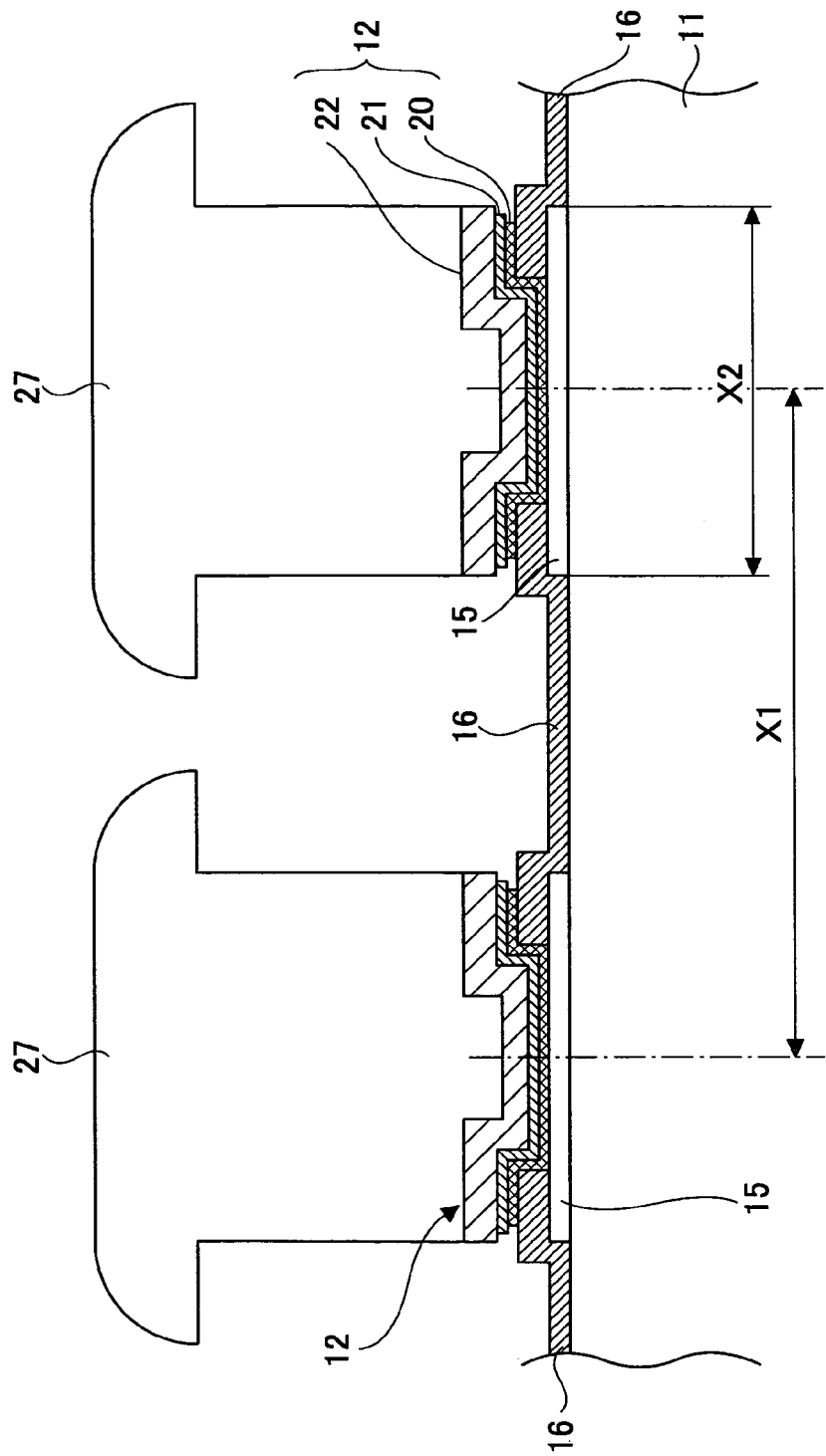
FIG. 10 illustrates etching the Ti layer using the Cu layer as a mask in the fabricating process of the semiconductor device.

Then, as illustrated in FIG. 10, the Ti layer 20 is etched with fluorinated acid water solution, using the Cu layer 21 as a mask. When the Ni layer 22, the Cu layer 21, and the Ti layer 20 are etched, the barrier metal base 12 is shaped.

Through the above-described etching process, the diameter of the etched Ti layer 20 becomes 19.0 μm, which is very close to the 20-μm diameter of the resist opening pattern 26. Accordingly, a sufficiently wide contact area is obtained between the Ti layer 20 and the underlying aluminum electrode 15, which can prevent the aluminum electrode 15 from coming off due to the stress applied to the solder ball 13.

Figures 12, 13:
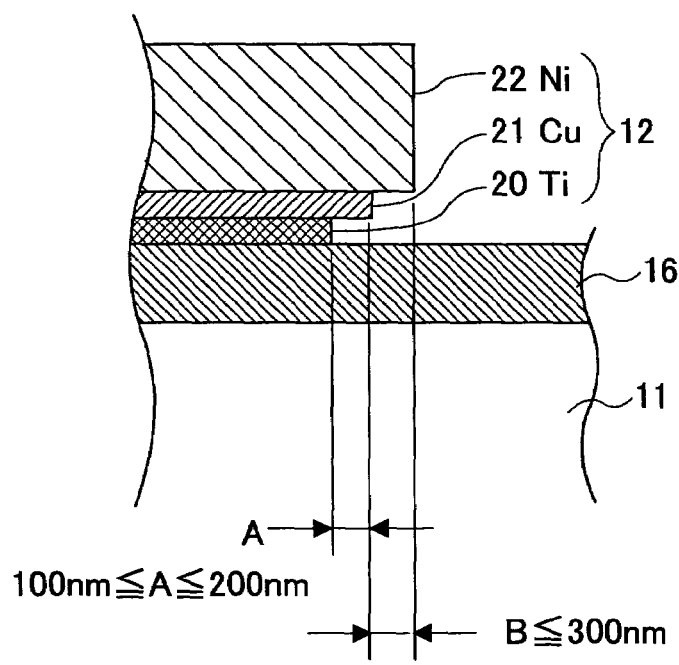
FIG. 12 is a diagram illustrating the side etch of the Ti layer in the fabricating process of the semiconductor device according to an embodiment of the invention.
FIG. 13 is a table illustrating an example of the ashing condition carried out as pretreatment prior to the plating step.

By appropriately adjusting the density of the fluorinated acid in the fluorinated acid water solution, the amount of side etch of the Ti layer 20 with respect to the upper Cu layer 21 can be set small, ranging from 100 nm to 200 nm, as indicated by the arrow A in FIG. 12. This side-etch amount is less than the conventional side-etch amount (generally, about 1.5 μm), so that the contact area between the Ti layer 20 and the aluminum electrode 15 is broadened, and the bonding strength is increased. The reduced amount of Ti side-etch can also prevent occurrence of migration, preventing the tin (Sn) contained in the solder 27 from diffusing through the Ti layer 20 into the aluminum electrode 15.

In this manner, the barrier metal base 12 is shaped by wet etching, without using an expensive dry etching apparatus. The manufacturing cost can thereby be reduced.

Figure 11:
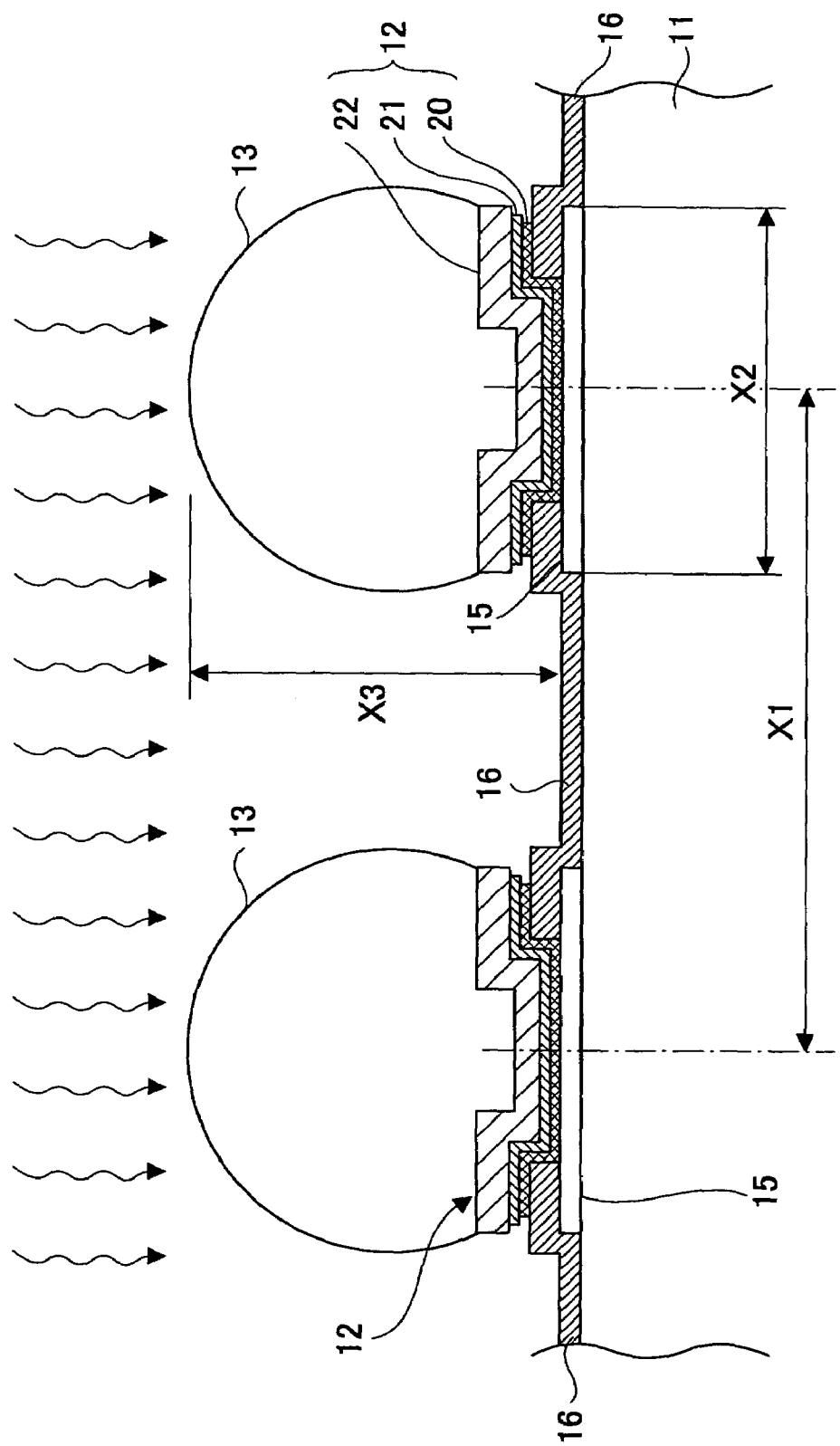
FIG. 11 illustrating forming a solder ball by reflow in the fabricating process of the semiconductor device according to an embodiment of the invention.

After the barrier metal base 12 is shaped, the solder 27 is shaped, as illustrated in FIG. 11. The solder 27 is made molten by fluxless reflow, using formic acid (carboxylic acid in this example) as the reductant (the reducing agent). In FIG. 11, solder balls 13 are formed by the reflow process. By employing fluxless reflow, short circuits, which are likely to occur during the solder melting process, can be prevented.

Thus, occurrence of short circuits is prevented by fluxless reflow because the reducing power is easily regulated, as compared with the conventional flux reflow. The melting solder is well-controlled so as not to expand to the surroundings.

Although in the above-described example carboxylic acid (formic acid) is used as the reductant, hydrogen may be used as the reductant in the fluxless reflow process. Alternatively, flux reflow using a certain type of flux containing synthetic rosin may be performed. In this case, the solder 27 can be shaped into a sphere without causing short circuits.

After the reflow process, the height of the solder ball 13 becomes 20 μm, which satisfies equation (2). The ratio of the height of the solder balls 13 to the pitch is 20/35, which is about 1.14/2. By conducting the above-described reflow process to shape the solder ball 13, adequately high solder balls 13 can be formed, while maintaining the narrow pitch, and consequently, the bonding reliability during the flip-chip process for mounting the semiconductor device 10 on a circuit board is improved.

This patent application is based on and claims the benefit of the earlier filing date of Japanese Patent Application No. 2003-411592 filed Dec. 10, 2003, the entire contents of which are incorporated herein by reference.

What is claimed is:

1. A semiconductor device comprising:
a semiconductor substrate; and
an array of protruding electrodes arranged at a pitch X1, each of the protruding electrodes having a height X3 and being formed on a barrier metal base of diameter X2 coupled to an electrode arranged on the semiconductor substrate so as to satisfy the relations $(X1/2) \leq X2 \leq (3*X1/4)$ and $(X1/2) \leq X3 \leq (3*X1/4)$.

2. The semiconductor device of claim 1, wherein the barrier metal base includes a nickel (Ni) layer, a copper (Cu) layer, and a titanium (Ti) layer arranged in this order from the top, and the titanium (Ti) layer has a side etch ranging from 100 nm to 200 nm with respect to the copper (Cu) layer.

* * * * *